US008845907B2

(12) United States Patent
Nystrom et al.

(10) Patent No.: US 8,845,907 B2
(45) Date of Patent: Sep. 30, 2014

(54) STRUCTURE AND METHOD TO FABRICATE TOOLING FOR BUMPING THIN FLEX CIRCUITS

(71) Applicant: Xerox Corporation, Norwalk, CT (US)

(72) Inventors: Peter J. Nystrom, Webster, NY (US); Bryan R. Dolan, Rochester, NY (US); Gary D. Redding, Victor, NY (US)

(73) Assignee: Xerox Corporation, Norwalk, CT (US)

( * ) Notice: Subject to any disclaimer, the term of this patent is extended or adjusted under 35 U.S.C. 154(b) by 35 days.

(21) Appl. No.: 13/721,896

(22) Filed: Dec. 20, 2012

(65) Prior Publication Data

US 2014/0178644 A1 Jun. 26, 2014

(51) Int. Cl.
*C25F 3/00* (2006.01)
*B41J 29/00* (2006.01)

(52) U.S. Cl.
CPC .............................. *B41J 29/00* (2013.01)
USPC .......................................................... 216/11

(58) Field of Classification Search
USPC .......................................................... 216/11
See application file for complete search history.

(56) References Cited

U.S. PATENT DOCUMENTS 5,791,552 A 8/1998 Werther
2011/0298871 A1 12/2011 Stephens et al.

OTHER PUBLICATIONS

Peter J. Nystrom et al., "High Density Electrical Interconnect Using Limited Density Flex Circuits", U.S. Appl. No. 13/240,829, filed Sep. 22, 2011.
Bryan R. Dolan et al., "In Situ Flexible Circuit Embossing to Form an Electrical Interconnect", U.S. Appl. No. 13/232,465, filed Sep. 14, 2011.
Bryan R. Dolan et al., "Method for Flex Circuit Bonding Without Solder Mask for High Density Electrical Interconnect", U.S. Appl. No. 13/472,734, filed May 16, 2012.

*Primary Examiner* — Roberts Culbert
(74) *Attorney, Agent, or Firm* — MH2 Technology Law Group LLP (57) ABSTRACT

A structure and method for a post plate of a die set that can be used to emboss a plurality of contact pads of a flexible printed circuit during the formation of a printer printhead. In one embodiment, a plurality of post plate posts can be formed, where each post plate post has a flat upper surface, generally straight sides, and a sharp corner where the flat upper surface and the generally straight sides intersect. Each post can be polished using, for example, a pad and an abrasive polishing compound or an electrochemical polishing process, to round the sharp corners to form a post having a rounded contour. In another embodiment, a plurality of post plate posts each having a rounded contour can be formed using a molding process.

12 Claims, 6 Drawing Sheets

STRUCTURE AND METHOD TO FABRICATE TOOLING FOR BUMPING THIN FLEX CIRCUITS

FIELD OF THE EMBODIMENTS

The present teachings relate to the field of ink jet printing devices and, more particularly, to a method and structure for bumping thin flexible printed circuits during the production of a high density piezoelectric ink jet print head and a method for forming a high density piezoelectric ink jet print head.

BACKGROUND OF THE EMBODIMENTS

Drop on demand ink jet technology is widely used in the printing industry. Printers using drop on demand ink jet technology can use either thermal ink jet technology or piezoelectric technology. Even though they are more expensive to manufacture than thermal ink jets, piezoelectric ink jets are generally favored, for example because they can use a wider variety of inks.

Piezoelectric ink jet print heads typically include a flexible diaphragm and an array of piezoelectric elements (i.e., transducers or actuators) attached to the diaphragm. When a voltage is applied to a piezoelectric element, typically through electrical connection with an electrode electrically coupled to a voltage source, the piezoelectric element bends or deflects causing the diaphragm to flex which expels a quantity of ink from an ink chamber through a nozzle. The flexing further draws ink into the ink chamber from a main ink reservoir through an opening to replace the expelled ink.

Increasing the printing resolution of an ink jet printer employing piezoelectric ink jet technology is a goal of design engineers. One way to increase the resolution is to increase the density of the piezoelectric elements. To attach an array of piezoelectric elements to pads or electrodes of a flexible printed circuit (flex circuit) or to a printed circuit board (PCB), a quantity (i.e., a microdrop) of conductor such as conductive epoxy, conductive paste, or another conductive material is dispensed individually on the top of each piezoelectric element. Electrodes of the flex circuit or PCB are placed in contact with each microdrop to facilitate electrical communication between each piezoelectric element and the electrodes of the flex circuit or PCB.

A flex circuit having an array of bumped (i.e., embossed) contact pads can also be attached to a piezoelectric array. The flex circuit can include an array of bumped contact pads, where each bumped pad is electrically coupled to a piezoelectric element using, for example, a conductor such as solder or conductive epoxy. Flex circuits including an array of bumped pads are discussed in U.S. Ser. No. 12/795,605, filed Jun. 7, 2010, and U.S. Ser. No. 13/232,465, filed Sep. 14, 2011, each of which is incorporated herein by reference in its entirety.

Embossing a flex circuit can be performed using a die set which includes a post plate having a plurality of posts that are square or rectangular in cross section and a die having a plurality of openings. The flex circuit with a plurality of unbumped contact pads is placed between the post plate and the die. The plurality of contact pads on the flex circuit is aligned with the posts and die openings, and pressure is applied between the post plate and die such that the contact pads are forced into the openings by the posts. Because the contact pads are metal they maintain their deformed shape to provide a plurality of embossed contact pads of a bumped flex circuit.

As resolution and density of the print heads increase, the area available to provide electrical interconnects decreases. Routing of other functions within the head, such as ink feed structures, compete for this reduced space and place restrictions on the types of materials used. Methods for manufacturing a print head having closely space electrical contacts that can be manufactured with increased yields and improved reliability would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a method for forming a post plate for embossing a printhead flexible printed circuit can include anisotropically etching a post plate blank to form a plurality of posts each having a square or rectangular cross section, a flat upper surface, generally straight sides, and sharp corners where the flat upper surface and the generally straight sides intersect, and polishing the plurality of posts to round the sharp corners and to form a plurality of polished posts each having a rounded contour.

In another embodiment of the present teachings, a method for forming a post plate blank for embossing a printhead flexible printed circuit can include forming a post plate mold having a plurality of recesses therein, wherein each recess is a negative of a post plate post having a rounded contour, dispensing a material selected from the group consisting of molding compound, epoxy, thermoset, thermoplastic, and metal into the plurality of recesses, curing the material within the post plate mold, and removing the cured material from the post plate mold to form a post plate having a plurality of posts each having a rounded contour.

In another embodiment of the present teachings, a method for forming a post plate comprising a plurality of posts for embossing a printhead flexible printed circuit can include plating a plurality of exposed first portions of a post plate base layer to form a first post layer comprising a plurality of spaced first post layer portions, wherein an unexposed second portion of the post plate base layer remains unplated by the first post plate layer, plating a plurality of exposed third portions of the post plate base layer to form a second post layer comprising a plurality of spaced second post layer portions, wherein an unexposed fourth portion of the post plate base layer remains unplated by the second post plate layer, and each second post plate layer portion overlaps one of the first post layer portions, and plating a plurality of exposed fifth portions of the post plate base layer to form a third post layer comprising a plurality of spaced third post layer portions, wherein an unexposed sixth portion of the post plate base layer remains unplated by the third post plate layer, and each third post plate layer portion overlaps one of the first post layer portions and one of the second post layer portions, wherein each of the plurality of posts comprises a first post layer portion, a second post layer portion, and a third post layer portion.

In another embodiment of the present teachings, a post plate for embossing a printhead flexible printed circuit can include a base, a post array comprising a plurality of posts, wherein each of the plurality of posts is adapted to emboss a flexible printed circuit contact pad and each of the plurality of posts comprises a first end connected to the base and a second end connected to the first end and extending away from the base, wherein the second end is shaped as one of a semisphere and a paraboloid.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts.

As used herein, unless otherwise specified, the word "printer" encompasses any apparatus that performs a print outputting function for any purpose, such as a digital copier, bookmaking machine, facsimile machine, a multi-function machine, electrostatographic device, etc.

Figure 14:
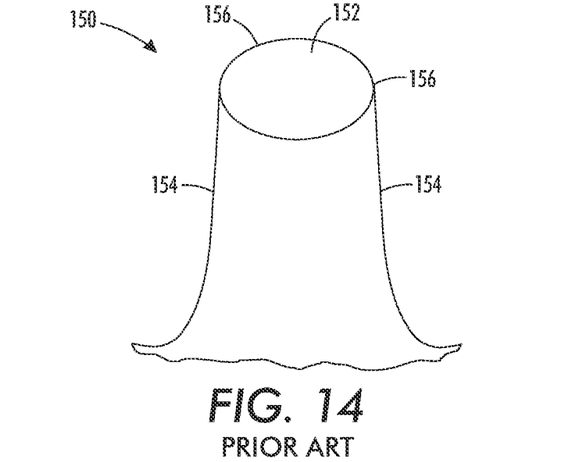
FIG. 14 is a perspective depiction of a conventional post having a flat upper surface and a rectangular cross section.

As described above, some prior methods of embossing a flex circuit include a post plate having, in cross section, square or rectangular posts with sharp angles or corners. For example, FIG. 14 is a perspective depiction of a post 150 having a square or rectangular cross section, a flat upper surface 152, generally straight sides 154, and sharp corners 156 (i.e., corners having an angle of between about 90° and about 110°) where the sides 154 intersect the flat upper surface 152. Deforming the contact pads of the flex circuit with this post plate design is sufficient for printhead flex circuits having larger contact pads. However, as future piezoelectric element density increases, the surface area and spacing of the flex circuit contact pads also decreases. This results in a more concentrated force distribution within the area of the individual bump that can lead to cracks and/or creasing in the metallization, or perforation of flex circuit features. This type of metal stress in flex circuit traces can lead to decreased device yields and lifetime reliability when subjected to environmental stresses during use of the device. Cracking can be reduced by increasing spacing between the edge of the post and the edge of the opening in the die, but this can lead to weaker, less defined bumps and requires more spacing which negatively impacts the ability to densely pack the bumps.

Embodiments of the present teachings may result in a more reliable connection to a transducer array, particularly as transducer arrays and flex circuit contact pads continue to become smaller and more dense, for example as printheads move from 75 or 150 dots or posts per inch (dpi) to 300, 600, or 1200 dpi or higher. More dense transducer arrays require a corresponding increase in flex circuit pad densities. Additionally, embodiments of the present teachings may form posts with a high degree of accuracy needed with increasing piezoelectric transducer array densities and the resulting decrease in size of the flex circuit contact pads. Further, the present teachings include embodiments for forming a post plate for embossing a flex circuit for a printhead that reduces or eliminates tearing of the flex circuit contact pads during embossing. The completed post plate may include a plurality of posts, with each post having a rounded contour and a smooth surface that releases easily from the flex circuit after embossing.

Figure 1:
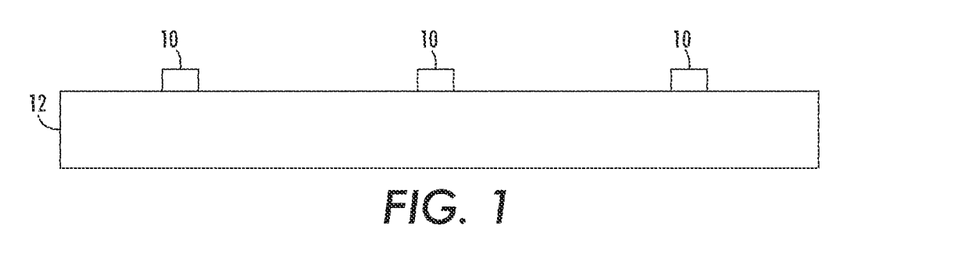
FIGS. 1-3 are cross sections depicting a portion of an in-process post plate in accordance with an embodiment of the present teachings.

A first embodiment for forming a bumped flex circuit is depicted in FIGS. 1-4. Referring to FIG. 1, a patterned mask 10 is formed over a post plate blank 12. The post plate blank 12 can include a metal layer such as stainless steel, an alloy, or a polymer layer. The thickness of the post plate blank 12, and the size and spacing (i.e., pitch) of each element of the patterned mask 10, will depend on the size and spacing of the contact pads on the flex circuit to be embossed. The patterned mask 10 can be formed with a high degree of accuracy using, for example, optical photolithography, and the patterned mask 10 may therefore include a photoresist layer. In other embodiments, the patterned mask 10 can be a layer formed by a screen print process.

Figure 2:
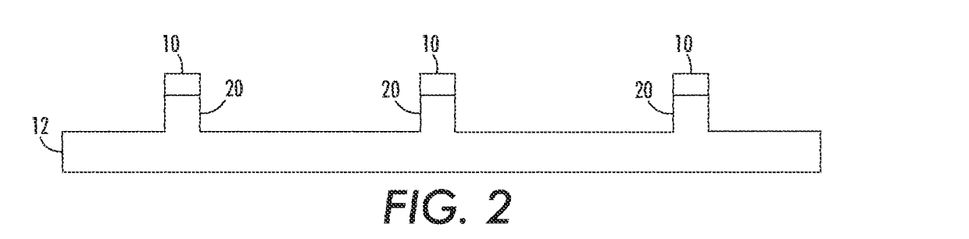
Figure 3:
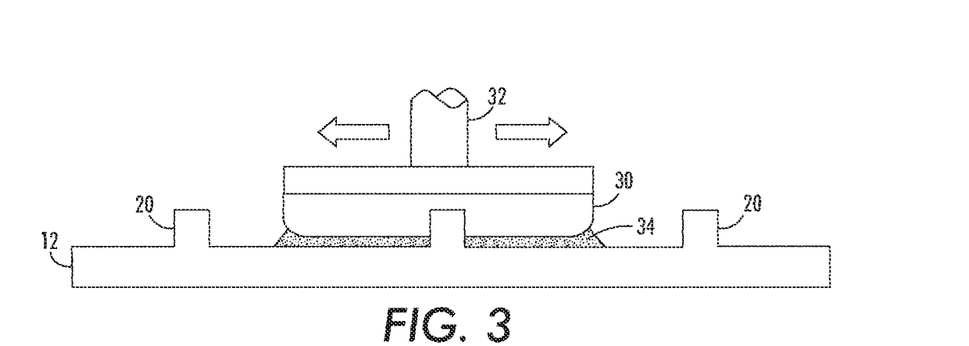

Next, as depicted in FIG. 2, the post plate blank 12 is vertically etched using the patterned mask 10 as a pattern. Vertical anisotropic etches are known in the art and will depend on the material used for the post plate blank 12. In this embodiment, the etch is halted prior to etching entirely through the thickness of the post plate blank 12 and results in an array of posts 20. While FIG. 3 depicts three posts, it will be understood that the post array may include hundreds or thousands of posts, depending on the printhead design.

Subsequently, the patterned mask 10 may be removed, for example using a photoresist stripping process, and a polishing process is performed as depicted in the FIG. 3 cross section. Optionally, the patterned mask 10 can be removed during the polishing process itself. Polishing can include the use of a polishing pad 30 rotating about an axis 32 to polish the array of posts 20 to remove the sharp angles of the posts. It will be understood that the depiction of the elements in the FIGS. is not necessarily to scale. Polishing can further include the use of an abrasive polishing compound 34 such as an abrasive paste, slurry, or lapping compound, that is between the polishing pad 30 and the post plate blank 12. The polishing compound 34 can be dispensed onto the polishing pad 30 and/or the upper surface of the post plate blank 12.

During polishing, a polishing pressure is applied between the polishing pad 30 and the post plate blank 12 as the polishing pad 30 is moved over the surface of the post plate blank 12. Polishing speed and the contour of the completed posts can be controlled by the polishing pressure, the texture of the polishing pad 30, the degree of abrasiveness of the slurry, and the rotational speed of the polishing pad 30 about the axis 32. In an exemplary process, the polishing compound 34 can include a 1400 to 1800 grit lapping compound, for example a 1600 grit lapping compound, and the polishing pad 30 can include a wool burr in a die grinder. A pressure of 50 psi or less, for example between about 0.1 psi and about 10 psi, can be applied between the polishing pad 30 and the post plate 12. Other natural and synthetic polishing pad materials are contemplated, as are other polishing pressures and polishing compounds, depending on the design and material of the post plate. The polishing can round the sharp corners of the posts 20 to form a plurality of posts each having a rounded contour and provide a smooth surface that releases from the flex circuit after embossing. After polishing, any remaining polishing compound can be removed from the surface of the post plate 12 to result in a completed post plate 40 having a plurality of contoured posts 42 and a base 44 similar to that depicted in FIG. 4.

Figure 4:
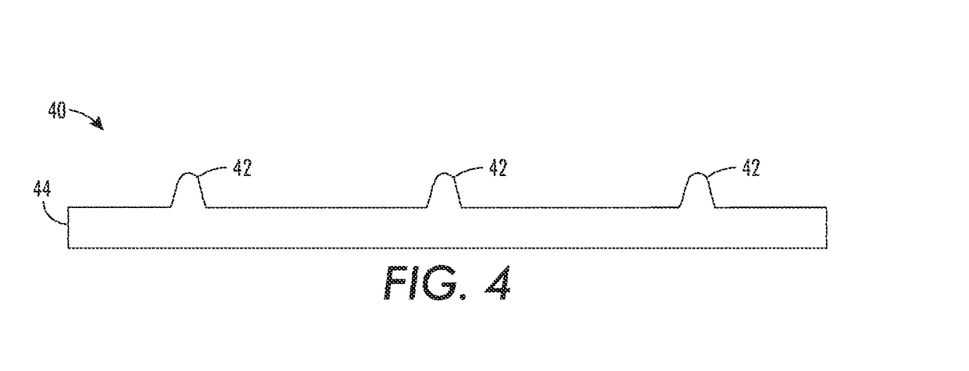
FIG. 4 is a cross section of a portion of a completed post plate in accordance with an embodiment of the present teachings.

As depicted in FIG. 4, a plurality of posts 42 can form an array of posts for embossing a plurality of contact pads for a flex circuit. Depending on the flex circuit design, the array of posts can be in the form of a grid of posts. As depicted in FIG. 4, each post 42 can include a first end connected to the base 44 and a second end connected to the first end and extending away from the base. The second end can be shaped as a semisphere or paraboloid as depicted in FIG. 4 such that, in cross section, the posts have a semispherical or parabolic profile. The two cross-sectional sidewalls of each post 42 that extends from the base 44 to the second end as depicted in FIG. 4 can form an angle of between about 90° (if the second end is a semisphere) to about 110° with upper major surface of the base 44. The completed post plate can have a post density in both the X- and Y-directions of between about 300 dpi (i.e., posts per inch) or higher, for example between about 300 dpi and about 2400 dpi, or between about 600 dpi and about 2400 dpi, or even greater than about 2400 dpi. A pitch of the posts within the post array can be between about 10 μm and about 1000 μm, or higher than about 1000 μm.

Figures 5, 6:
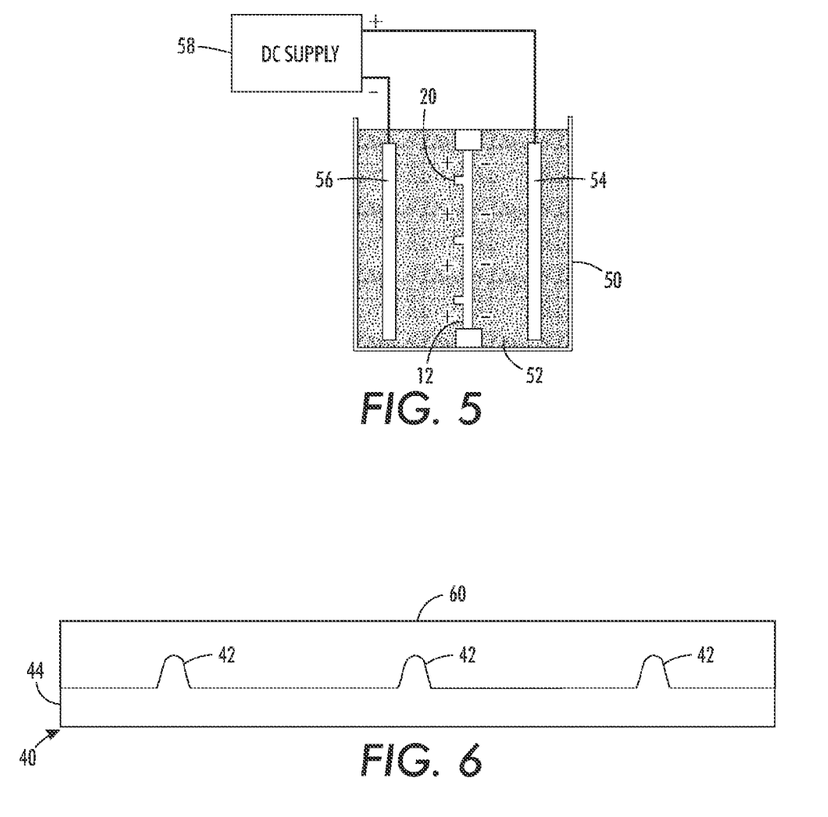
FIG. 5 is a cross section depicting the formation of an in-process post plate in accordance with an embodiment of the present teachings.
FIGS. 6 and 7 are cross sections depicting the formation of a post plate mold used to form a molded post plate in accordance with an embodiment of the present teachings.

In another embodiment, an electrochemical polish (i.e., electropolish or e-polish) can be performed on a metal post plate blank to form a completed plate having posts with rounded contours. In this embodiment, a post plate blank 12 similar to that depicted in FIG. 2 can be formed, for example, from stainless steel. The patterned mask 10 is removed, then the post plate blank 12 is placed within a receptacle 50 containing an electrolyte solution 52, and interposed between an anode 54 and a cathode 56 of a DC power supply 58 with the posts 20 facing the cathode as depicted in FIG. 5. Subsequently, a current is passed from the anode 54 to the cathode 56 such that the metal surface of post plate blank 12 oxidizes and dissolves in the electrolyte solution 52. In one embodiment, the e-polish process can include a DC power of between about 400 watts and about 600 watts, for example about 500 watts, for a polishing duration of between about 20 seconds and about 60 seconds, for example about 30 seconds. Due to field concentrations of the electropolish process, sharp corners of the posts 12 are removed, thereby resulting in a completed post plate 40 similar to that depicted in FIG. 4. Appropriate solutions, electrode materials, and DC voltages can be determined by one of ordinary skill in the art.

Figure 7:
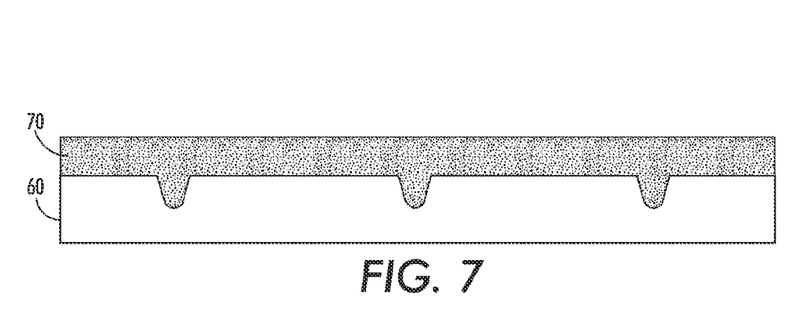

In another embodiment, a negative post plate mold can be produced so that a large number of identical copies of the completed post plate 40 (FIG. 4) can be made for production purposes. For example, as depicted in FIG. 6, a post plate mold 60 can be made using the completed post plate of FIG. 4 as a pattern. The post plate mold 60 can be formed from electroplated nickel or another material that is sufficiently resilient to hold up to the molding process. Once the post plate mold 60 is complete as depicted in FIG. 7, a viscous material such as a casting or molding compound, an epoxy, a thermo-setting material (thermoset), a thermoplastic, etc., can be dispensed over the surface of the mold 60 and into the mold recesses, and then cured to form a molded post plate 70. In another embodiment, the post plate mold 60 and the viscous material that forms the molded post plate 70 can both be metals. The same metal can be used for both structures if a release layer is formed on the mold 60 prior to dispensing the viscous material into the mold 60. A release layer on the mold 60 may not be needed if different metals that do not adhere to one another are used for the molded post plate 70 and the mold (for example copper to form the molded post plate 70 and nickel to form the post plate mold 60). The viscous material can be cured using a curing process appropriate for the material, for example by cooling the material if a metal is used, using UV light if a UV curable material is used, etc. Production quantities of uniform completed post plates 70 each having a plurality of rounded contoured posts can be manufactured using the post plate mold 60. A polymer or releasable metal may also be used to form the mold 60. The material of the completed post plate 70 should be sufficiently hard to retain its shape and not crack or break upon the application of pressure during the embossing process, for example copper, nickel, chromium, etc. The post plate can be plated with a metal to form the completed post plate 70.

Figure 8:
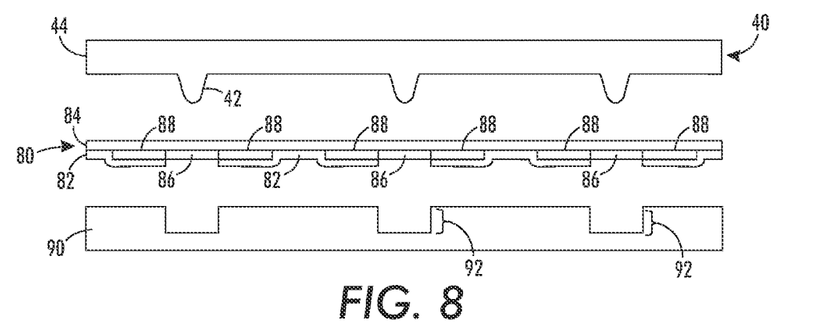
FIGS. 8-10 are cross sections depicting embossing of an array of flex circuit contact pads in accordance with an embodiment of the present teachings.
Figure 9:
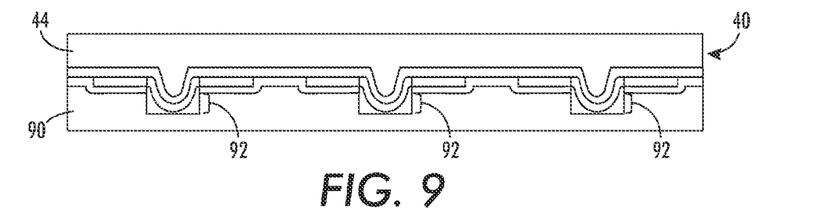
Figure 10:
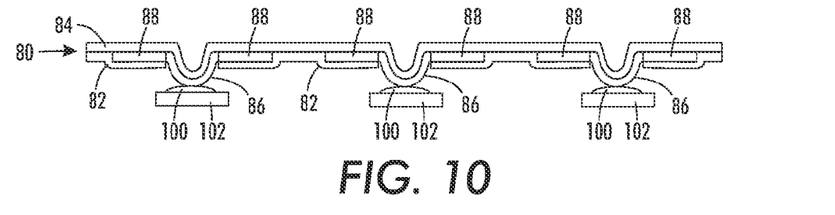

After completing the post plate according to any of the disclosed embodiments, the completed post plate 40 can be used to emboss a flex circuit 80 as depicted in FIGS. 8-10. The flex circuit can include a first dielectric layer 82 (i.e., a solder mask) and a second dielectric layer 84, each of which can be polyimide or another dielectric. The flex circuit can further include an array of contact pads 86, each of which can be continuous with one or more conductive circuit traces 88. A die 90 having a plurality of recesses or openings 92, together with the post plate 40, forms a die set. The flex circuit 80 is aligned with, and interposed between, the post plate 40 and the die 90 as depicted in FIG. 8. The posts 42 are placed in contact with the second dielectric layer 84 over the contact pads 86 as depicted in FIG. 9 (or in direct contact with the contact pads 86 if the flex circuit 80 does not include a second dielectric layer 84), then pressure is applied between the post plate 80 and the die 90. Upon the application of pressure, each post 42 forces one of the contact pads 86 into one of the recesses 92 in the die, thereby embossing the array of contact pads 86 as depicted in FIG. 9. The flex circuit is then removed from the die set 40, 90, to result in the embossed flex circuit of FIG. 10. Each contact pad 86 can be physically and electrically coupled to a piezoelectric element 100 which is part of a transducer array, for example using a conductor 102 such as a solder, a conductive paste, or an asperity contact. It will be understood that the FIGS. represent generalized schematic illustrations and that other structures can be added or existing structures can be removed or modified.

During the embossing of the flex circuit, die 90 and/or the posts 42 may leave a mark, indentation, or imprint (not individually depicted for simplicity) on one of the dielectric layers 82, 84 or the contact pads 86.

Figure 11:
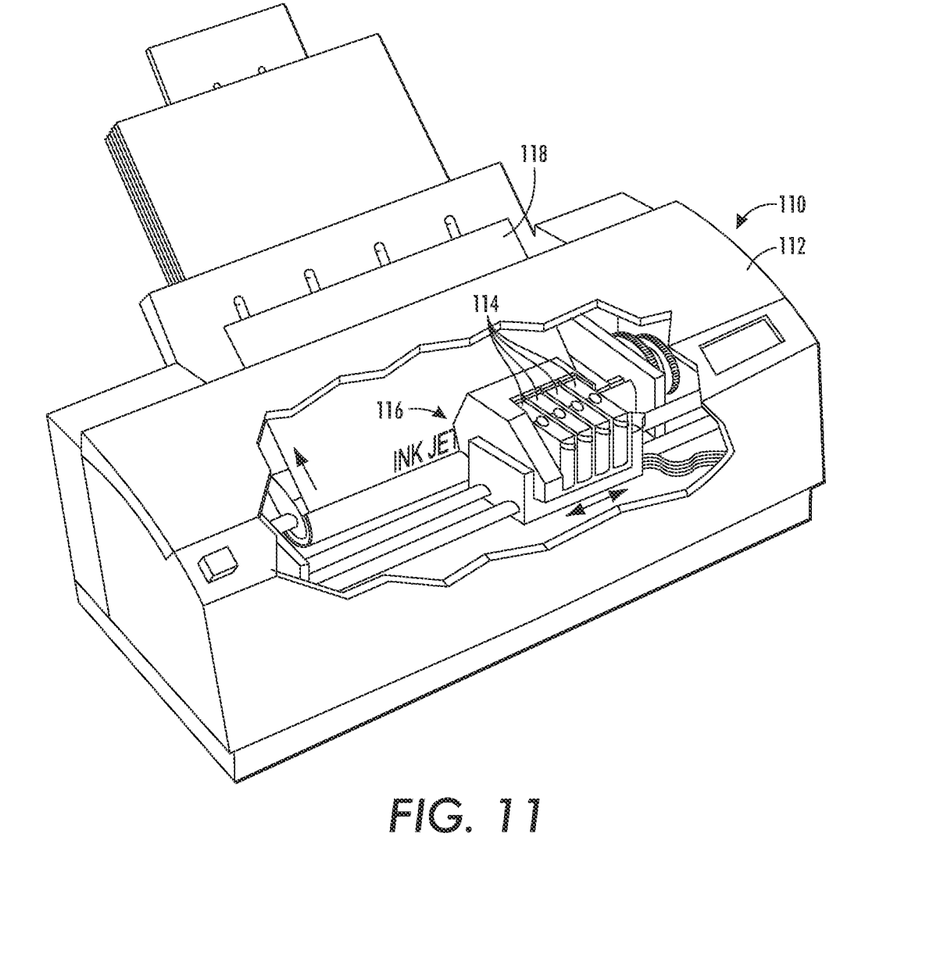
FIG. 11 is a perspective view of a printer which can be formed using one or more printheads in accordance with an embodiment of the present teachings.

FIG. 11 depicts a printer 110 including a printer housing 112 into which at least one printhead 114 formed using the methods and structures of the present teachings has been installed. During operation, ink 116 is ejected from one or more printheads 114. The printhead 114 is operated in accordance with digital instructions to create a desired image on a print medium 118 such as a paper sheet, plastic, etc. The printhead 114 may move back and forth relative to the print medium 118 in a scanning motion to generate the printed image swath by swath. Alternately, the printhead 114 may be held fixed and the print medium 118 moved relative to it, creating an image as wide as the printhead 114 in a single pass. The printhead 114 can be narrower than, or as wide as, the print medium 118. In another embodiment, the printhead 114 can print to an intermediate surface such as a rotating drum or belt (not depicted for simplicity) for subsequent transfer to a print medium.

Other methods of forming a completed post plate 40 such as that depicted in FIG. 4 are also contemplated. For example, an etched post blank 12 similar to that depicted in FIG. 2 can be formed, the mask 10 can be removed, and the post plate blank can be exposed to an etchant, such as an isotropic wet etch or an isotropic dry etch. The etch chemistry and other etch parameters will depend on the material of the post plate blank 12. An isotropic etch can etch the post plate blank 12 of FIG. 2 to result in a completed post plate 40 similar to that depicted in FIG. 4.

Figure 12A:
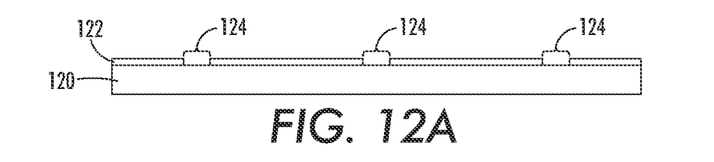
FIGS. 12A-12E are cross sections depicting formation of a post plate using a series of masks and an additive plating process.

In the embodiment of FIGS. 12A-12E, a series of masks can be used during a selective plating process to form a completed post plate having approximated rounded contoured posts. As depicted in FIG. 12A, a base layer 120, such as a layer of stainless steel, nickel, copper, aluminum, iron, alloy, etc., layer can have a first patterned mask 122 formed thereon. The first patterned mask 122 includes a plurality of openings 124 therein that expose the base layer 120. In this embodiment, the base layer can have a thickness that is sufficiently rigid, for example about 4 mils or greater, depending on the stiffness of the material. In an embodiment, the base layer 120 can have a thickness of between 4 mils and about 1.0 inch, or between about 4 mils and about 0.5 inch, or between about 4 mils and about 8 mils. The material of the patterned mask 122 (and subsequent masks) inhibits the formation of a plating layer over the base layer 120. For example, the first mask layer 122 can include a photoresist layer formed using a photolithographic process, a polyimide layer that is patterned using a photolithographic process, or a polymer layer formed using a screen printing process. Other mask layer materials are contemplated. The openings 124 can have a width of between about 3 mils and about 50 mils, or between about 3 mils and about 25 mils, or between about 6 mils and about 20 mils.

Figure 12B:
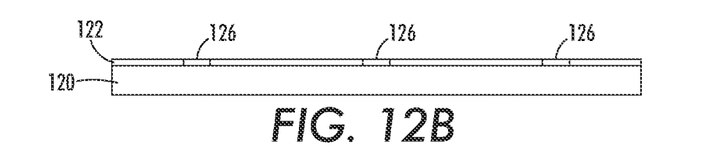
Figure 13:
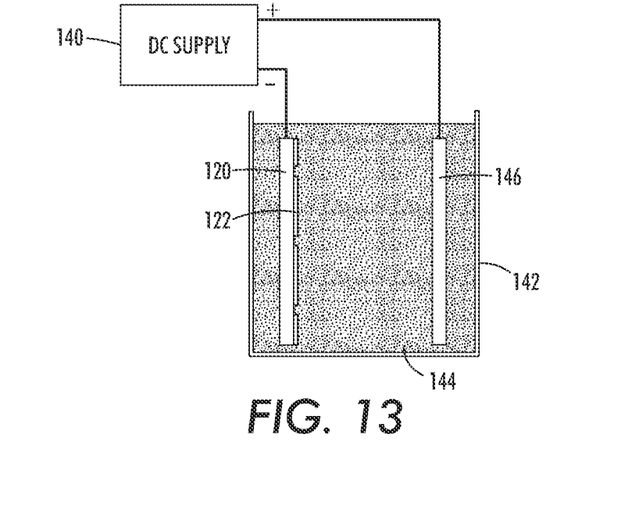
FIG. 13 is a cross section depicting plating of various FIG. 12 structures.

After forming the FIG. 12A structure, it is placed into an electroplating bath such as that depicted in FIG. 13, which includes a DC power supply 140, a reservoir 142, an electroplating solution 144, a metal donor 146 that functions as an anode, while the base layer 120 functions as the cathode. Plating techniques are well known in the art. The portions of the base layer 120 that are exposed by the openings 124 in the first mask layer 122 are plated while the portions of the base layer 120 that are covered by the first mask layer 122 are not plated. The plating process forms a first post layer 126 on and over the base layer 120 as depicted in FIG. 12B.

Figure 12C:
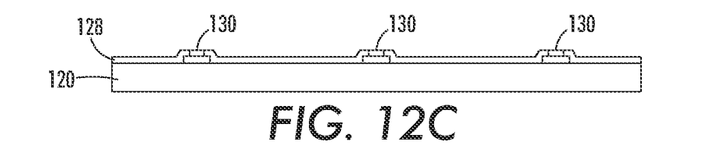

Subsequently, the first mask layer 122 can be removed and a second mask layer 128 is formed over the base layer 120 and over a portion of the first post layer 126 as depicted in FIG. 12C. In this embodiment, openings within the second mask layer 128 are narrower than the first post layer 126. The openings within the second mask layer expose first portions of the base layer 120 and first portions of the first post layer 126, while the material of the second mask layer 128 covers second portions of the base layer 120 and second portions of the first post layer 126. After forming the second mask layer 128, the base layer is plated using, for example, a process similar to that depicted in FIG. 13, to form a second post layer 130 on and over the first post layer 126 and over the base layer 120. The second post layer 130 can overlap and contact the first post layer 126 as depicted.

Figure 12D:
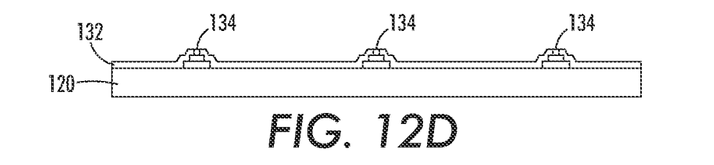
Figure 12E:
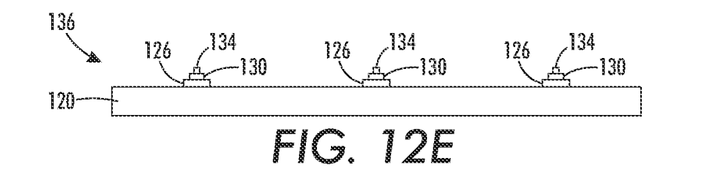

Next, as depicted in FIG. 12D, the second mask layer 128 is removed and a third mask layer 132 having openings therein are formed over the base layer 120, the first post layer 126, and the second post layer 128. As depicted in FIG. 12D, the openings in the third mask layer 132 expose first portions of the base layer 120, the first post layer 126, and the second post layer 130, while second portions of the base layer 120, the first post layer 126, and the second post layer 130 remain covered by the third mask layer 132. The structure is plated to form a third post layer 134 on and over the second post layer 130, and over the first post layer 126 and the base layer 120. The third mask layer 132 can then be removed to result in the completed post pad 136 as depicted in FIG. 12E. As depicted in FIG. 12E, the third post plate layer 134 can overlap and contact the second post layer 130, and can overlap the first post layer 126.

It will be understood that any number of iterations of masking and plating can be performed to form an array of posts each with a desired rounded, contoured profile. The stepped profile of the posts as depicted in FIG. 12E becomes less stepped with an increasing number of masks and post layers.

In this embodiment, each post after completion can have a height of between about 2 mils to about 10 mils, or between about 2 mils and about 6 mils, or between about 3 mils to about 6 mils. In an embodiment, the first post layer 126 can provide about 40% of the height of each post, while each of the second post layer 130 and third post layer 134 can provide about 30% of the height. In another embodiment, the first post layer 126 can provide about 60% of the height of each post, while each of the second post layer 130 and third post layer 134 can provide about 20% of the height. In yet another embodiment, the first post layer 126 can provide about 70% of the height of each post, the second post layer 130 can provide about 20% the height of the post, and the third post layer 134 can provide about 10% of the height.

In another embodiment, the completed post may include less than three layers, for example two layers, or more than three layers. In a two layer embodiment, for example that includes only a first post layer 126 and a second post layer 130, each layer can provide 50% of the completed post height. In another embodiment, the first post layer 126 can provide 60% of the completed post height while the second post layer 130 provides 40% of the completed post height. In yet another embodiment, the first post layer 126 can provide 90% of the completed post height while the second post layer 130 provides 10% of the completed post height.

In another embodiment, the masking steps of FIGS. 12A-12D can be reversed such that the narrowest post layer is formed first and the widest post layer is formed last, with the second post layer 130 completely overlapping the first post layer 126 and directly contacting the first post layer 126 and the base layer 120, and the third post layer 134 completely overlapping the first post layer 126 and the second post layer 130, and directly contacting the second post layer 126 and the base layer 120. This may result in a plurality of posts, where each post has an aspect ratio that is sufficient to emboss a flex circuit contact pad.

In various embodiments for forming a plurality of completed posts as part of a die set, each completed post can have a width of between about 3 mils and about 50 mils, or between about 3 mils and about 25 mils, or between about 6 mils and about 20 mils. Further, each completed post can have a height of between about 2 mils to about 10 mils, or between about 2 mils and about 6 mils, or between about 3 mils to about 6 mils.

Other post widths and heights are contemplated, depending on the size and density of the flex circuit contact pads.

Thus an embodiment of the present teachings may improve the quality of a flex bumping process by fabricating an embossing die set without sharp edges while maintaining a controlled uniform bump height. Further, the post plate can be produced at a high volume using a reproducible method of fabrication. By creating an embossing die set using, for example, a photo-chemical etch process and a post electropolish, a uniform, high-quality plate can be produced. Additionally, a similar result can be achieved by electroplating the die set and then electropolishing, or electroplating using multi-level masking with or without an electropolish. Any of the embodiments discussed above can be used to manufacture a high-quality master part that can molded to create a mold that can be used to produce a large number of uniform production post plates.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming a post plate for embossing a printhead flexible printed circuit, comprising:
   anisotropically etching a post plate blank to form a plurality of posts each having a square or rectangular cross section, a flat upper surface, generally straight sides, and sharp corners where the flat upper surface and the generally straight sides intersect; and
   polishing the plurality of posts to round the sharp corners and to form a plurality of polished posts each having a rounded contour.

2. The method of claim 1, further comprising:
   dispensing a polishing compound between a polishing pad and the post plate blank having the plurality of posts;
   applying a pressure between the polishing pad and the post plate blank; and
   rotating the polishing pad while applying the pressure to polish the plurality of posts to form the plurality of posts each having the rounded contour.

3. The method of claim 2, further comprising:
   providing a wool burr polishing pad; and
   performing the polishing using the wool burr polishing pad.

4. The method of claim 2, further comprising applying a pressure of between about 0.1 psi and about 50 psi between the polishing pad and the post plate blank during the polishing.

5. The method of claim 1, where the post plate blank is stainless steel and the method further comprises:
   placing the post plate blank into a receptacle containing an electrolyte solution;
   interposing the post plate blank between a DC anode and a DC cathode; and
   passing a current from the anode to the cathode to electropolish the post plate blank to form the plurality of polished posts each having the rounded contour.

6. The method of claim 1, further comprising:
   forming a patterned photoresist layer over the post plate blank; and
   performing the anisotropic etch using the patterned photoresist layer as a pattern to form the plurality of posts.

7. The method of claim 1, further comprising:
   subsequent to polishing the plurality of posts, embossing a plurality of flexible printed circuit contact pads using the plurality of polished posts; and physically and electrically coupling each embossed flexible circuit contact pad to a piezoelectric element using a conductor.

8. A method for forming a post plate blank for embossing a printhead flexible printed circuit, comprising:
   forming a post plate mold having a plurality of recesses therein, wherein each recess is a negative of a post plate post having a rounded contour;
   dispensing a material selected from the group consisting of molding compound, epoxy, thermoset, thermoplastic, and metal into the plurality of recesses;
   curing the material within the post plate mold; and
   removing the cured material from the post plate mold to form a post plate having a plurality of posts each having a rounded contour.

9. The method of claim 8, further comprising:
   embossing a plurality of flexible printed circuit contact pads using the plurality of posts; and
   physically and electrically coupling each embossed flexible circuit contact pad to a piezoelectric element using a conductor.

10. The method of claim 1, further comprising exposing the plurality of posts to an etchant to isotropically etch the plurality of posts each having the square or rectangular cross section to form the plurality of polished posts each having the rounded contour.

11. A method for forming a post plate comprising a plurality of posts for embossing a printhead flexible printed circuit, comprising:
   plating a plurality of exposed first portions of a post plate base layer to form a first post layer comprising a plurality of spaced first post layer portions, wherein an unexposed second portion of the post plate base layer remains unplated by the first post plate layer;
   plating a plurality of exposed third portions of the post plate base layer to form a second post layer comprising a plurality of spaced second post layer portions, wherein an unexposed fourth portion of the post plate base layer remains unplated by the second post plate layer, and each second post plate layer portion overlaps one of the first post layer portions; and
   plating a plurality of exposed fifth portions of the post plate base layer to form a third post layer comprising a plurality of spaced third post layer portions, wherein an unexposed sixth portion of the post plate base layer remains unplated by the third post plate layer, and each third post plate layer portion overlaps one of the first post layer portions and one of the second post layer portions,
   wherein each of the plurality of posts comprises a first post layer portion, a second post layer portion, and a third post layer portion.

12. The method of claim 11, further comprising:
   forming each of the plurality of spaced second post layer portions to have a width that is narrower than a width of each of the plurality of spaced first post layer portions; and
   forming each of the plurality of spaced third post layer portions to have a width that is narrower than the width of each of the plurality of spaced second post layer portions.

\* \* \* \* \*